United States Patent
Mizuochi et al.

(10) Patent No.: US 8,158,955 B2
(45) Date of Patent: *Apr. 17, 2012

(54) CHARGED PARTICLE BEAM APPLICATION APPARATUS

(75) Inventors: Masaki Mizuochi, Hitachinaka (JP); Shoji Tomida, Hitachinaka (JP)

(73) Assignee: Hitachi High-Technologies Corporation, Tokyo (JP)

( * ) Notice: Subject to any disclaimer, the term of this patent is extended or adjusted under 35 U.S.C. 154(b) by 55 days.

This patent is subject to a terminal disclaimer.

(21) Appl. No.: 12/828,781

(22) Filed: Jul. 1, 2010

(65) Prior Publication Data
US 2010/0264330 A1 Oct. 21, 2010

Related U.S. Application Data

(63) Continuation of application No. 12/137,128, filed on Jun. 11, 2008, now Pat. No. 7,763,863.

(30) Foreign Application Priority Data

Jun. 13, 2007 (JP) .................................. 2007-156357

(51) Int. Cl.
*H02N 13/00* (2006.01)

(52) U.S. Cl. ......... 250/441.11; 250/440.11; 250/442.11; 361/234

(58) Field of Classification Search .............. 250/440.1, 250/441.11, 442.11; 361/234; 156/345
See application file for complete search history.

(56) References Cited

U.S. PATENT DOCUMENTS

| | | | | |
|---|---|---|---|---|
| 4,789,294 A | * | 12/1988 | Sato et al. | 414/416.03 |
| 5,350,479 A | * | 9/1994 | Collins et al. | 156/345.53 |
| 5,382,311 A | * | 1/1995 | Ishikawa et al. | 156/345.54 |
| 5,535,090 A | * | 7/1996 | Sherman | 361/234 |
| 5,556,204 A | | 9/1996 | Tamura et al. | |
| 5,572,398 A | * | 11/1996 | Federlin et al. | 361/234 |
| 5,583,737 A | * | 12/1996 | Collins et al. | 361/234 |
| 5,631,803 A | * | 5/1997 | Cameron et al. | 361/234 |
| 5,695,564 A | * | 12/1997 | Imahashi | 118/719 |
| 5,781,400 A | | 7/1998 | Takahashi et al. | |
| 5,868,848 A | * | 2/1999 | Tsukamoto | 118/723 E |

(Continued)

FOREIGN PATENT DOCUMENTS

JP    2000-040481    2/2000

(Continued)

OTHER PUBLICATIONS

Japanese Office Action, with partial English translation, issued in Japanese Patent Application No. 2007-156357, dated Sep. 27, 2011.

*Primary Examiner* — David A Vanore

(74) *Attorney, Agent, or Firm* — McDermott Will & Emery LLP

(57) ABSTRACT

An apparatus capable of improving image quality by making it possible to suck specimens of different sizes electrostatically, and uniformalizing an electric field of a specimen edge portion, while suppressing increase in prime cost is provided. Specimen holding means is an electrostatic chuck, a master flat plane part surrounding a specimen of the largest size of specimen sizes, and an opening surrounding a specimen size except for the largest specimen size are included at an outer peripheral portion of the electrostatic chuck, a dummy specimen attachable to and detachable from the electrostatic chuck is included, and at a time of switching the specimen size, a dummy specimen is selected (or may be prevented from being used).

11 Claims, 6 Drawing Sheets

U.S. PATENT DOCUMENTS

| | | | |
|---|---|---|---|
| 6,023,405 A * | 2/2000 | Shamouilian et al. | 361/234 |
| 6,077,357 A * | 6/2000 | Rossman et al. | 118/728 |
| 6,370,007 B2 | 4/2002 | Takahasi et al. | |
| 6,373,681 B2 | 4/2002 | Kanno et al. | |
| 6,490,144 B1 * | 12/2002 | Narendrnath et al. | 361/234 |
| 6,506,687 B1 | 1/2003 | Izawa et al. | |
| 6,508,199 B1 * | 1/2003 | Oyabu | 118/723 E |
| 6,509,564 B1 | 1/2003 | Suzuki et al. | |
| 6,583,979 B1 | 6/2003 | Takahasi et al. | |
| 6,646,233 B2 * | 11/2003 | Kanno et al. | 219/390 |
| 6,676,804 B1 * | 1/2004 | Koshimizu et al. | 156/345.53 |
| 6,716,301 B2 | 4/2004 | Kanno et al. | |
| 6,759,338 B2 | 7/2004 | Ohmoto et al. | |
| 6,768,113 B2 | 7/2004 | Suzuki et al. | |
| 6,825,617 B2 | 11/2004 | Kanno et al. | |
| 6,895,179 B2 | 5/2005 | Kanno et al. | |
| 6,903,338 B2 | 6/2005 | Mankos et al. | |
| 7,138,606 B2 | 11/2006 | Kanno et al. | |
| 7,138,629 B2 | 11/2006 | Noji et al. | |
| 7,288,166 B2 | 10/2007 | Ohmoto et al. | |
| 7,335,278 B2 * | 2/2008 | Koshimizu et al. | 156/345.53 |
| 7,408,760 B2 | 8/2008 | Tanimoto et al. | |
| 7,481,230 B2 * | 1/2009 | Sakima | 134/1.1 |
| 7,763,863 B2 * | 7/2010 | Mizuochi et al. | 250/440.11 |
| 2003/0111616 A1 | 6/2003 | Suzuki et al. | |
| 2007/0256638 A1 | 11/2007 | Honda et al. | |
| 2007/0284337 A1 | 12/2007 | Mochizuki et al. | |
| 2008/0308743 A1 | 12/2008 | Mizuochi et al. | |
| 2009/0133835 A1 * | 5/2009 | Nishimoto et al. | 156/345.27 |

FOREIGN PATENT DOCUMENTS

| | | |
|---|---|---|
| JP | 2004-079516 | 3/2004 |
| JP | 2004-235149 | 8/2004 |
| JP | 2004-363085 A | 12/2004 |

* cited by examiner

CHARGED PARTICLE BEAM APPLICATION APPARATUS

RELATED APPLICATIONS

This application is a Continuation of U.S. patent application Ser. No. 12/137,128, filed on Jun. 11, 2008, now U.S. Pat. No. 7,763,863, claiming priority of Japanese Patent Application No. 2007-156357, filed on Jun. 13, 2007, the entire contents of each of which are hereby incorporated by reference.

BACKGROUND OF THE INVENTION

The present invention relates to a charged particle beam application apparatus such as an electron microscope, an ion-beam machining/observation apparatus or the like.

In recent years, the integration densities of semiconductor products have been more and more enhanced, and higher definition of the circuit patterns is demanded. In the specimens on which circuit patterns are formed, typified by semiconductor wafers, various kinds of inspection means are used for the purpose of quality control and enhancement of yield. There are cited, for example, a scanning electron microscope (hereinafter, called a length measuring SEM) which irradiates charged particle beam to measure the dimensional accuracy of a circuit pattern, a scanning electron microscope (hereinafter, called a review SEM) which also irradiates charged particle beam to evaluate a defect of a circuit pattern or attached extraneous matters, and the like.

In the observation of a specimen typified by a wafer by using charged particle beam, the electric field distribution of the periphery of the specimen edge changes, and therefore, the image quality degradation such as distortion, or blur of the observation image of the above described periphery occurs. As the influence of this phenomenon, various problems are caused such as occurrence of an error to a measurement dimensional value, erroneous detection of a defect, and inability to obtain a clear image. As the means for solving the problems, there is proposed a method for controlling the electric field of the periphery of the edge to be uniform by adding a ring-shaped conductor element capable of applying a voltage to the specimen holding means in the vicinity of the specimen edge (see JP-A-2004-235149). Further, as another means, there is proposed a method for making the distribution of an electric field gentle by narrowing the height gap of the edge and the specimen holding means which has conventionally existed by surrounding the specimen by a specimen positioning component with substantially the same height as the specimen (see JP-A-2004-79516).

Depending on the specimen holding state, the observed image significantly differs. As an example of mechanical specimen holding, there is a method in which two reference pins are provided at the outer periphery of a specimen, and the specimen is held by the pressing force by a movable pin from the opposing direction. In this method, the holding force which increases the pressing force for the specimen increases, and a deviation of the specimen due to vibration can be reduced. However, the specimen is distorted on one hand, and observation with favorable accuracy becomes difficult. Further, since the wafer is thin, and the flatness is low (parallelism of the single body is favorable), the specimen tends to be held in the form of a concave shape or a convex shape. In such a state, the height significantly varies with the movement of the specimen (about 100 μm at the maximum), and therefore, the depth of focus or focus movable length of the electron-optical system has to be set to be large. This becomes a large constraint to the electronic lens design, and it becomes difficult to increase the resolution which leads to improvement in image quality. Thus, by using an electrostatic chuck for the specimen holding means, flattening of the specimen surface and reinforcement of the holding force can be achieved at the same time.

BRIEF SUMMARY OF THE INVENTION

An electrostatic chuck is very effective as the specimen holding means in a vacuum, but is generally made of ceramics and its manufacture cost is high. Accordingly, it leads to substantial increase in prime cost to prepare a holder attachable and detachable to and from a stage as the specimen holding means for each specimen size. Further, when the electrostatic chuck is fixed to the stage, if the specimen size is switched to a small specimen size, the surface to which the specimen is not sucked appears, which is highly likely to suck foreign matters, and when the specimen size is switched to a large specimen size, there is the fear that the specimen catches the foreign matters, and the specimen surface distorts.

On the other hand, in the conventional means for uniformalizing the electric field of the specimen edge, each of the aforementioned means is the proposal intended for a different holder for each specimen size, and as many electrostatic chucks as holders are required. As a result, substantial increase in prime cost is inevitable.

The present invention is contrived to solve the above described problems, and an object of the present invention is to provide an apparatus which makes it possible to suck specimens of different sizes electrostatically and improves image quality by uniformalizing an electric field of a specimen edge portion, while suppressing increase in prime cost.

In a charged particle beam application apparatus including a stage which moves a specimen, and specimen holding means which is included on the stage and holds the specimen, and treats specimens of at least two kinds of sizes, the specimen holding means is an electrostatic chuck, a master flat plane part which surrounds a specimen of a largest size of the specimen sizes, and an opening which surrounds the specimen size other than the largest specimen size are included at an outer circumferential portion of the electrostatic chuck, a dummy specimen attachable to and detachable from the electrostatic chuck is included, and at a time of switching the specimen size, the dummy specimen is selected (the dummy specimen may be prevented from being used).

The height of the master flat plane part is desired to be substantially the same as a specimen height of the largest specimen size.

The thickness of the dummy specimen is desired to be substantially the same as a specimen thickness corresponding to a dimension of the opening.

The dummy specimen is desired to be of the same material as the specimen.

The dummy specimen is desired to be in contact with an earth intended for static dissipation.

The dummy specimen and the specimen are desired to have transport mechanisms which are respectively attachable to and detachable from the stage individually.

The electrostatic chuck is desired to be provided with a groove portion or a non-suction portion in the vicinity of the specimen size except for the largest specimen size.

It is desirable to include positioning means which positions the specimen and dummy specimen on the stage.

Further, a stocker capable of storing at least one dummy specimen or more is included, and transport means which is capable of selecting a dummy specimen in accordance with a size and a material of the specimen to be treated is included.

According to the present invention, an apparatus capable of significantly enhancing throughput as compared with the conventional apparatus by reducing or eliminating a stage setting time while securing image precision can be provided.

Other objects, features and advantages of the invention will become apparent from the following description of the embodiments of the invention taken in conjunction with the accompanying drawings.

DETAILED DESCRIPTION OF THE INVENTION

Figure 1:
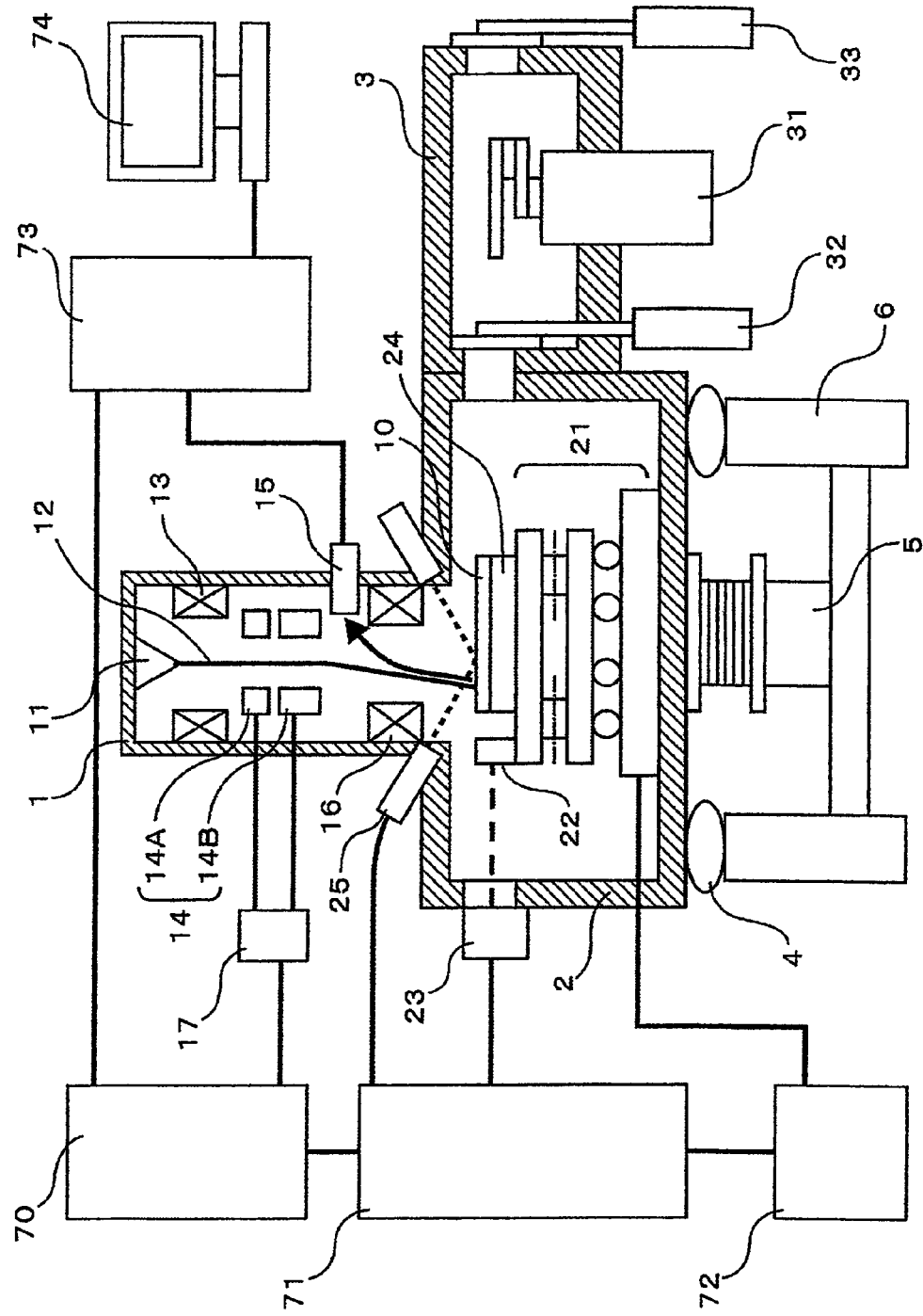
FIG. 1 is a plane view showing an entire apparatus of the present invention.

The present invention will be described with reference to FIGS. 1 to 3, by taking a scanning electron microscope as an example as a charged particle beam application apparatus to which the present invention is applied.

First, the apparatus constitution shown in FIG. 1 will be described.

A mount 4 which damps a floor vibration is mounted on a pedestal 6 installed on a floor, and the mount 4 further supports a specimen chamber 2. The specimen chamber 2 is mounted with a column 1 which generates and controls electronic beam, and a load lock 3 containing a transport robot 31 which transports a specimen. The specimen chamber is always evacuated by a vacuum pump 5, and the inside of the column 1 is also kept at a high vacuum degree by a vacuum pump not illustrated. Meanwhile, the load lock 3 is mounted with an atmosphere side gate valve 33 which isolates the load lock 3 from atmosphere, and a vacuum side gate valve 32 which isolates the load lock 3 from the specimen chamber 2.

Here, the transport route for a specimen will be briefly described.

The atmosphere side gate valve 33 is opened, and a specimen 10 is introduced into the load lock 3 from the atmosphere side by the transport robot 31. The atmosphere side gate valve 33 is closed, and the inside of the load lock 3 is evacuated by a vacuum pump not illustrated. When the vacuum degree becomes about the same as the inside of the specimen chamber 2, the vacuum side gate valve 32 is opened, and the specimen 10 is transported onto a stage 21 which is contained in the specimen chamber 2, by the transport robot 31. After the specimen 10 is treated, the specimen passes through the load lock 3 in the reverse order and is returned to the atmosphere.

The specimen 10 is electrostatically sucked by an electrostatic chuck 24 mounted on the stage 21, and is firmly held on the stage 21. A bar mirror 22 is also mounted on the stage 21, and by performing laser measurement of relative distance change to an interferometer 23 mounted on the specimen chamber 2, the specimen position on the stage can be controlled. The positional information of the stage is generated in a position control section 71, and thereafter, is transmitted to a stage control section 72 which drives the stage. In the stage control section 72, feedback control is performed so that the deviation between the present positional information and target coordinates is eliminated. As for the feedback control, the control which is performed by only simple position feedback, the PID control which enhances the response speed and positioning accuracy by adding the speed information of the stage and the integral information of the stage position deviation, and the like are conceivable.

Meanwhile, electron beam 12 which is generated by an electron gun 11 in the column 1 passes through an electron lens 13 having a convergent action and an electron lens 16, and is deflected to a desired track by a deflector 14, and thereafter, is irradiated to the specimen 10. A reflection electron or a secondary electron generated by irradiation of the electron beam is detected by a detector 15, and is transmitted to an image control section 73 together with the control information of the deflector 14. Here, an image is generated based on the control information of the deflector and the obtained information from the detector, and the image is projected on a monitor 74.

An optical type Z sensor 25 which detects the height of a specimen is mounted at the upper side of the specimen chamber 2, and is capable of always monitoring the height of the specimen, and the obtained signal is subjected to positional conversion in the position control section 71, and thereafter, is transmitted to the column control section. By the information, the optical conditions of the electron lens are changed in the column control section, and the electron lens is treated so that the focus does not shift even if the height of the specimen changes.

Next, with reference to FIGS. 2 and 3, details of the specimen holding state will be described.

Figure 2:
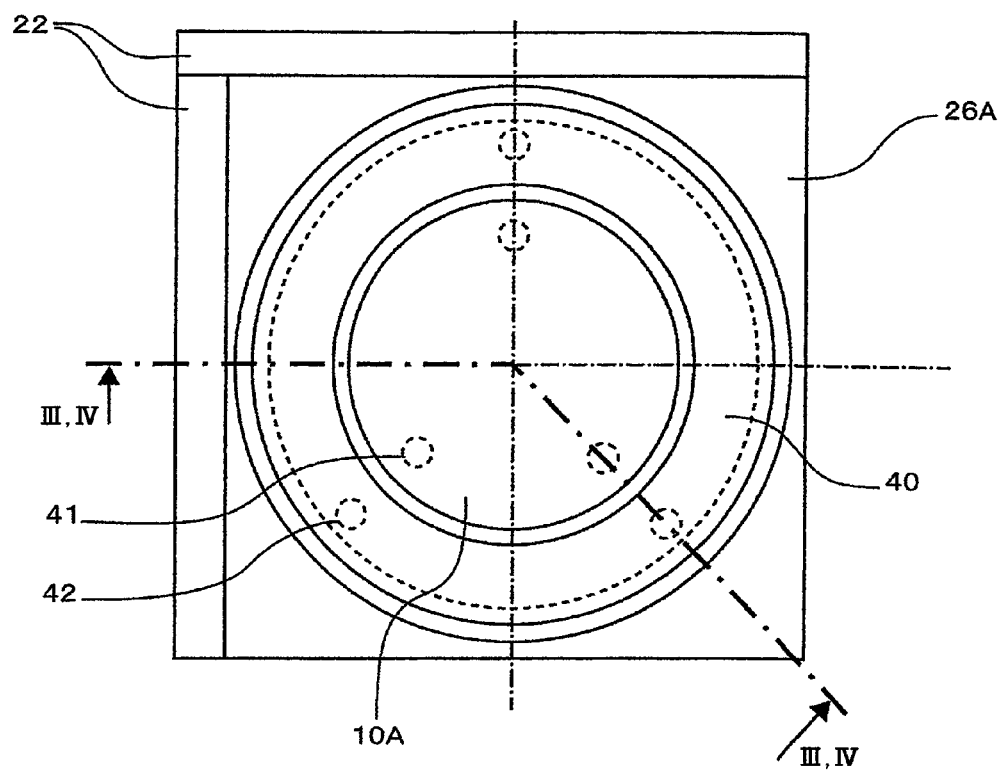
FIG. 2 is a plane view of a top table periphery in the case of applying a wafer of ϕ200 mm to the present invention.
Figure 3:
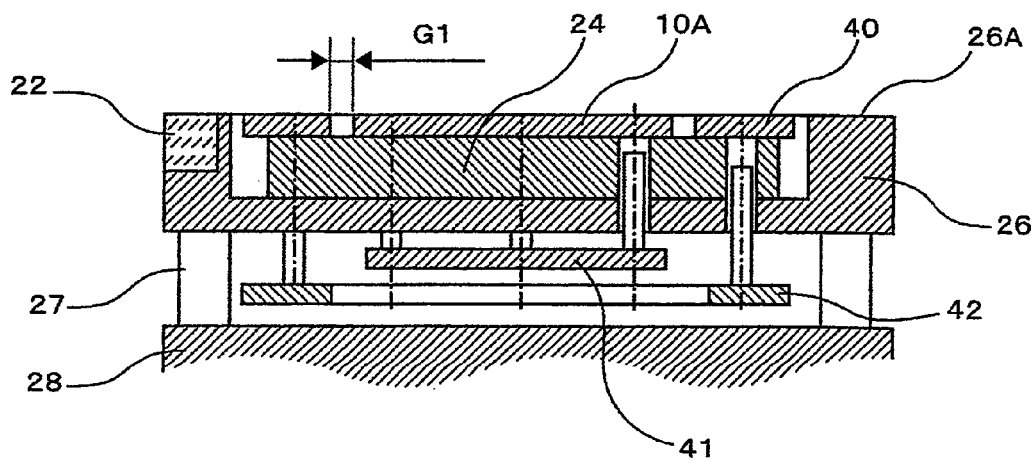
FIG. 3 is a sectional view of the top table periphery taken along the line in the case of applying a wafer of ϕ200 mm to the present invention.

FIG. 2 shows specimen holding means corresponding to different specimen sizes. FIG. 3 shows a section taken along the line in FIG. 2. Here, for the sake of clarity, explanation will be made on the assumption that the corresponding specimen sizes are two kinds, that is, a wafer of ϕ300 mm and a wafer of ϕ200 mm. In FIG. 2, a wafer 10A of 200 mm is sucked on the electrostatic chuck, and a dummy specimen 40 is similarly chucked on an electrostatic chuck 24. Here, it should be noted that the electric path is set so that a master flat plane part 26A, the wafer 10A of 200 mm and the dummy specimen 40 are at an equal potential. A gap G1 exists between the dummy specimen 40 and the wafer 10A of 200 mm, and the distribution state of the surface potential changes depending on its size. Accordingly, it is desirable to make G1 as small as possible and uniform over the entire circumference. Further, for the purpose of removing the wafer 10A of 200 mm and the dummy specimen 40 from the electrostatic chuck 24 respectively, a specimen arm 41 and a dummy arm 42 vertically movable are provided and respectively connected to an actuator not illustrated. Thereby, in the case of continuously treating the wafer of 200 mm, only the wafer of 200 mm can be transported while the dummy specimen is left on the electrostatic chuck.

Figure 4:
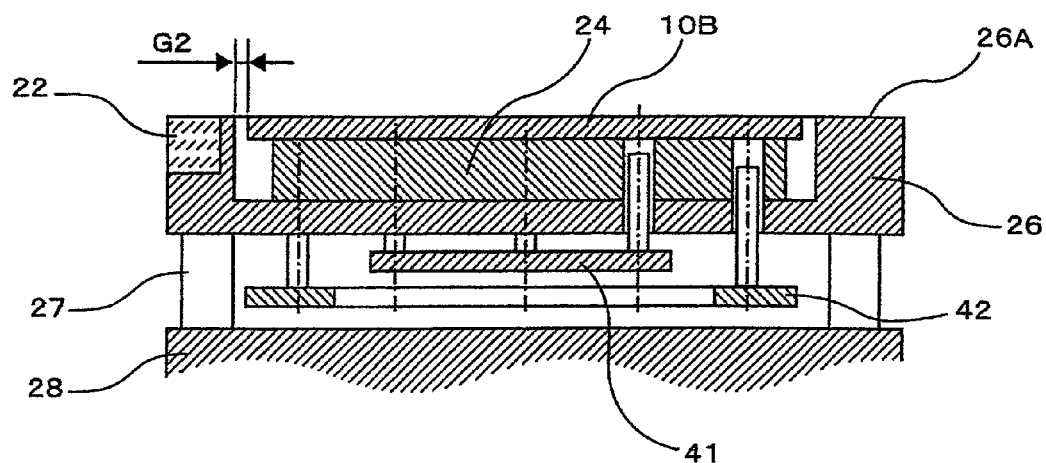
FIG. 4 is a sectional view of the top table periphery taken along the line IV-IV in the case of applying a wafer of ϕ300 mm to the present invention.

FIG. 4 shows the state in which the specimen size is switched to a wafer 10B of φ300 mm. When the dummy specimen 40 is removed and the wafer 10B of φ300 mm is mounted, a gap G2 occurs between the master flat plane part 26A and the edge portion of the wafer 10B of φ300 mm. By making G2 small and by making the entire circumference uniform similarly to the aforementioned wafer of φ200 mm, the potential gradient becomes smaller and favorable image quality can be also obtained in the wafer peripheral portion.

Figure 5:
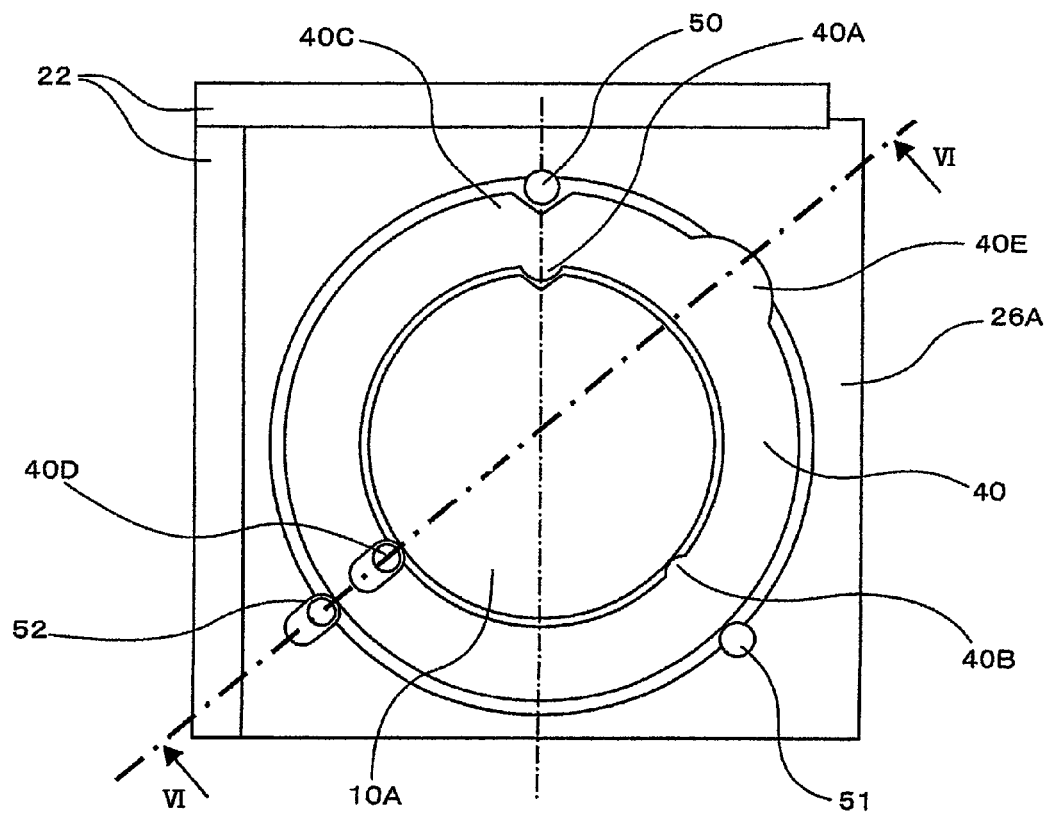
FIG. 5 is a plane view showing positioning of a specimen and a dummy specimen.
Figure 6:
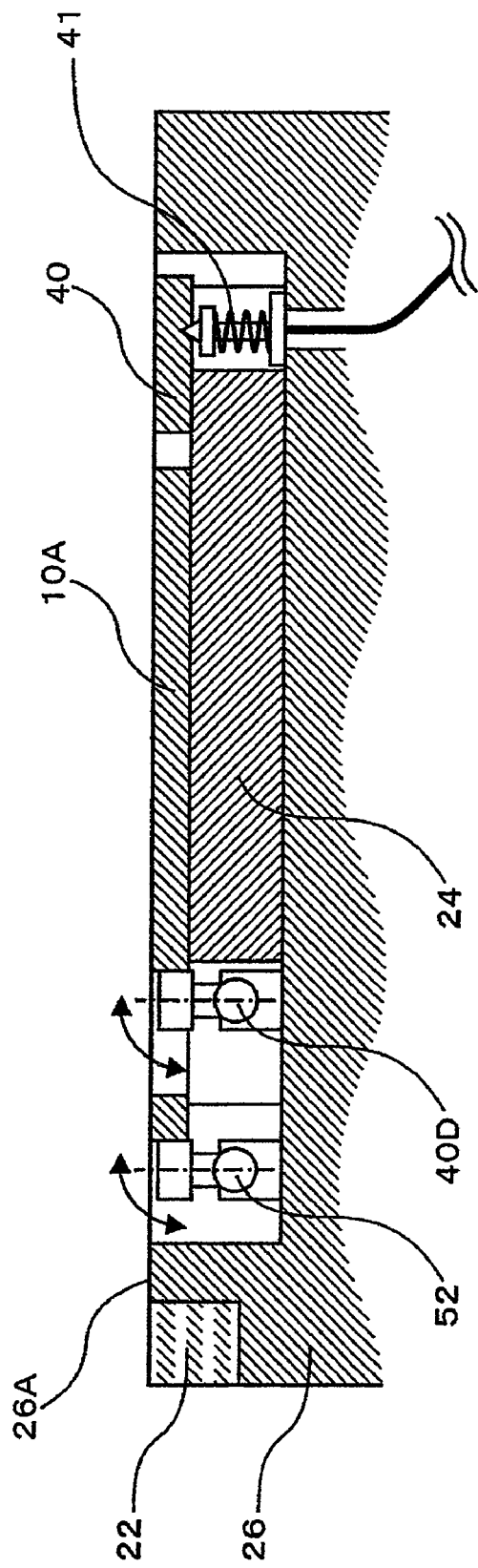
FIG. 6 is a sectional view taken along the line VI-VI showing positioning of the specimen and the dummy specimen.

Here, in the present invention, by providing the positioning means as shown in FIGS. 5 and 6, the above described gap can be controlled. The dummy specimen 40 is provided with a positioning projection 40A for a notch and a positioning projection 40B for an outer periphery, and a run-off portion of a movable pin 40D for a wafer of φ200 mm is provided at the position which is substantially equiangular from them. After the wafer 10A of φ200 mm which is transported with a certain degree of gap (up to about 1 mm) from these projections and the movable pin 40D for φ200 mm is mounted on the electrostatic chuck 24, the positioning accuracy is ensured by pressing the wafer against the above described two projections by the movable pin 40D for 200 mm. Thereafter, the wafer 10A of φ200 mm is completely fixed by electrostatic suction, and pressing of the movable pin 40D for 200 mm is released. The movable pin 40D for φ200 mm completely escapes downward from the surface of the electrostatic chuck 24 when the movable pin 40D is released, and thereby, it does not interfere with mounting of the wafer 10B of φ300 mm.

The sequence will be summarized as follows.

1) The wafer 10A of φ200 mm is mounted on the electrostatic chuck 24 while a certain degree of gap is kept between the positioning projection 40A for the notch and the positioning projection 40B for the outer periphery.

2) The movable pin 40D for φ200 mm is operated, and the wafer 10A of φ200 mm is pressed against the above described two projections.

3) Electrostatic suction is performed, and the wafer is completely fixed.

4) The movable pin 40D for φ200 mm is retreated.

For the contact portions of the aforementioned positioning projection 40A for the notch, positioning projection 40B for the outer periphery and the movable pin 40D for 200 mm with the wafer 10A of φ200 mm, the material or the surface treatment in which a foreign matter hardly occurs is effective. For example, a resin with high abrasion resistance, excellent conductivity and small emission gas in vacuum is effective.

Next, for positioning of the dummy specimen 40, the positioning means for the wafer of φ300 mm is utilized. Therefore, a notch 40C is formed at the outer periphery of the dummy specimen 40 as in the wafer to be a reference point in the rotational direction. A reference pin 50 for a notch and a reference pin 51 for an outer periphery are mounted on a top table 26, and the dummy specimen 40 is positioned by a movable pin 52 for φ300 mm.

The mounting procedure of the dummy specimen 40 (the same for the wafer of φ300 mm) will be shown as follows.

1) The dummy specimen 40 is mounted on the electrostatic chuck 24 while a certain degree of gap is kept from the reference pin 50 for the notch and the reference pin 51 for the outer periphery.

2) The movable pin 52 for φ300 mm is operated, and the dummy specimen 40 is pressed against the two reference pins.

3) Electrostatic suction is performed, and the wafer is completely fixed.

4) The movable pin 52 for φ300 mm is retreated.

Further, by providing an ordinary pattern (for example, a line pattern and a dot pattern) at the dummy specimen, various kinds of information can be collected. By measuring the distance of two selected patterns in time series, for example, the state of thermal expansion by temperature is known, and therefore, the temperature of the electrostatic chuck can be calculated from the result conversely. Alternatively, the transport accuracy of the dummy specimen can be calculated based on the pattern observation and the stage position information at this time. Further, while treating the specimen, contamination to the pattern due to quality of vacuum and adherence of a foreign matter can be tested for a long time. Further, by setting a certain pattern to be the reference of the size or the positional coordinates, as the standard pattern, the pattern can be also used for confirmation and correction of deformation of the stage, a beam drift and the like, and can be said to be very effective means.

When the dummy specimen is irradiated with charged particle and observed, the dummy specimen surface is charged, and the phenomenon that the image blurs or distorts occurs. As the countermeasure against this, an earth projection 40E is provided at the outer periphery of the dummy specimen 40 so as to contact an earth mechanism 43 mounted on the top table 26 by performing suction action to allow charges to escape. Here, "earth" means that the dummy specimen 40 is grounded to a voltage level at which the dummy specimen 40 should originally be, and does not indicate 0 V unconditionally. As the shape of the contact portion of the earth mechanism 43, a needle-shaped projection, and an edge shape in a knife form are conceivable, and the contact portion is pressed against the dummy specimen with a constant force by a compressing spring. The earth mechanism 43 brings about a state which is hardly chargeable, and observation with favorable image quality becomes possible for a long time.

The surface of the electrostatic chuck which is described so far is assumed to be in a uniform state, but a suction force occurs even in a small gap between the specimen and the dummy specimen, and therefore, the gap attracts a foreign matter. As the countermeasure against this, the present invention proposes an electrostatic chuck shown in FIGS. 7 and 8.

Figure 7:
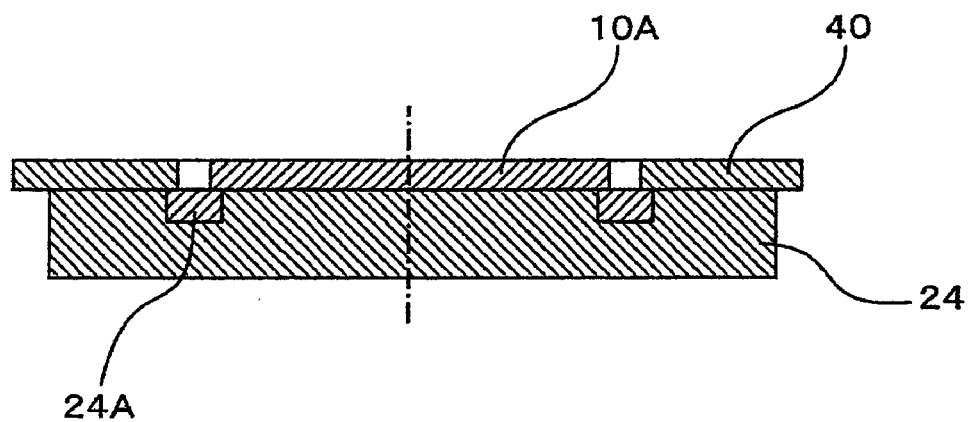
FIG. 7 is a sectional view showing electrostatic chuck of the present invention.

In the vicinity of the gap between the dummy specimen 40 and the wafer 10A of φ200 mm in the electrostatic chuck 24 shown in FIG. 7, the suction surface is covered with a mask member 24A, and the suction force is removed. FIG. 7 shows the state in which the wafer 10A of φ200 mm and the dummy specimen 40 are sucked by the electrostatic chuck 24. Here, the width of the mask member 24A is designed to be larger than the gap between the wafer 10A of φ200 mm and the dummy specimen 40, and thereby, suction of a foreign matter can be reliably removed.

Figure 8:
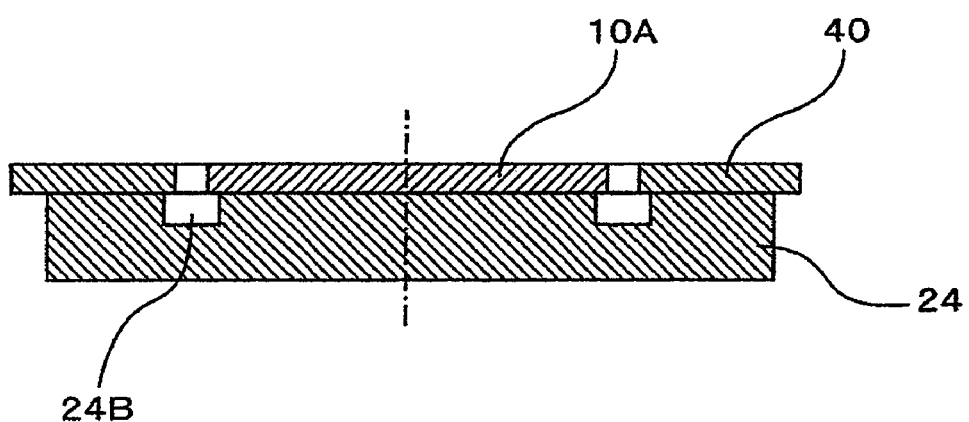
FIG. 8 is a sectional view showing the electrostatic chuck of the present invention.

Meanwhile, in the vicinity of the gap between the dummy specimen 40 and the wafer 10A of φ200 mm in the electrostatic chuck 24 shown in FIG. 8, a groove portion 24B is formed. Therefore, even if a foreign matter is sucked and the wafer of φ300 mm is sucked, the wafer is not deformed. The width of the groove portion 24B is designed to be larger than the gap between the wafer 10A of φ200 mm and the dummy specimen 40, and thereby, suction of the foreign substance can be reliably removed.

Figure 9:
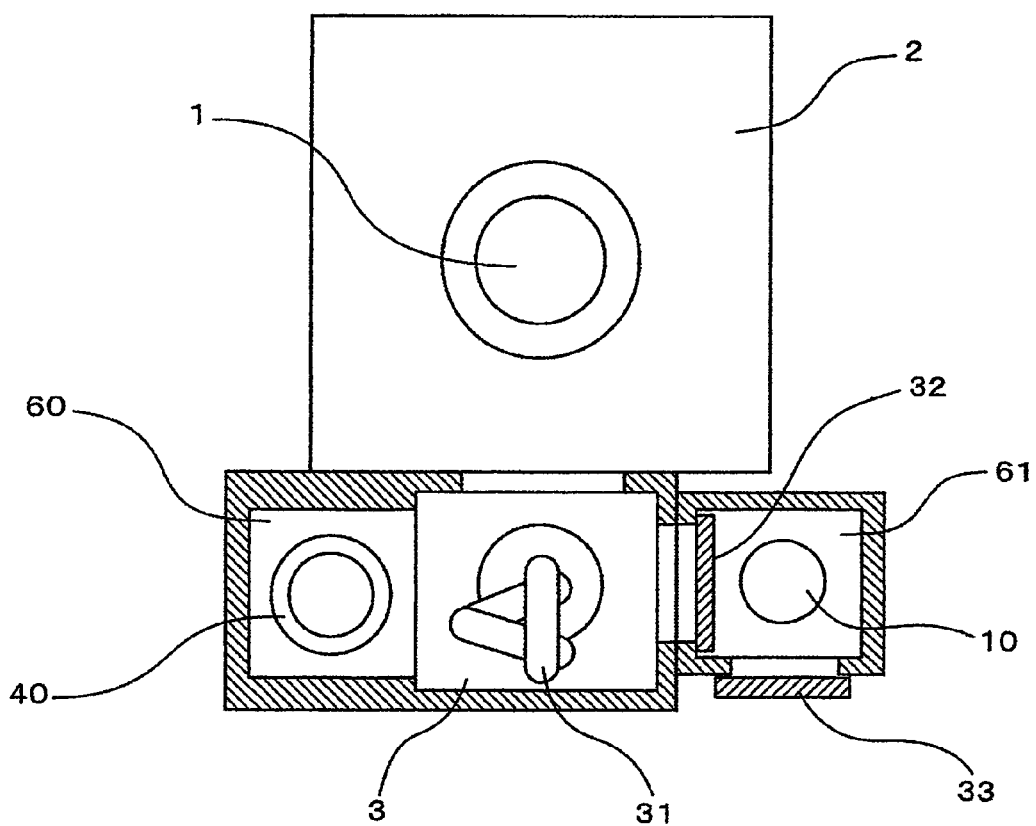
FIG. 9 is an explanatory view showing a transport system of the present invention.

Next, the transport mechanism of the present invention will be described with reference to FIG. 9.

The vacuum robot 31 is contained in the load lock 3 to transport the specimen 10 and the dummy specimen 40. The load lock 3 is mounted with a stoker 60 capable of storing at least one dummy specimen 40 or more, so that a dummy specimen for each specimen size or each material, or a spare dummy specimen can be on standby. Thereby, switch of the specimen size, and replacement with a spare dummy specimen can be carried out quickly, and therefore, reduction in availability of the apparatus can be suppressed.

It goes without saying that in the description above, the specimen size is applicable to the other wafers than the wafer of φ200 mm and the wafer of φ300 mm which are cited as examples.

According to the present invention described so far, the image quality can be improved by making it possible to suck specimens of different sizes electrostatically, and uniformalizing an electric field of a specimen edge portion, while suppressing increase in prime cost.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. A charged particle beam apparatus for observing or processing a specimen by irradiating the specimen with a charged particle beam, comprising,
   an optical system for guiding the charged particle beam onto the specimen, and
   a specimen holder including an electrostatic chuck for holding thereon the specimen to be moved,
   wherein the specimen holder is capable of holding thereon a dummy specimen having an outer diameter greater than an outer diameter of the electrostatic chuck together with the specimen having an outer diameter smaller than the outer diameter of the electrostatic chuck.

2. The charged particle beam apparatus according to claim 1, wherein the electrostatic chuck is capable of holding thereon the dummy specimen detachably from the electrostatic chuck.

3. The charged particle beam apparatus according to claim 1, wherein the electrostatic chuck has one of a groove and a non-attractive region which one communicates with a gap between the specimen and the dummy specimen.

4. The charged particle beam apparatus according to claim 1, further comprising a transfer mechanism for transferring the specimen and the dummy specimen independently of each other to be mounted onto a stage and to be taken out from the stage.

5. The charged particle beam apparatus according to claim 1, further comprising a stocker capable of holding thereon a plurality of the dummy specimens, and a transfer mechanism for transferring from the stocker one of the dummy specimens which one is selected in accordance with a size of the specimen and a material of the specimen.

6. A system comprising:
   a charged particle beam apparatus for observing or processing a specimen by irradiating the specimen with a charged particle beam, the charged particle beam apparatus comprising:
      (a) an optical system for guiding the charged particle beam onto the specimen; and
      (b) a specimen holder including an electrostatic chuck for holding thereon the specimen to be moved; and
   a dummy specimen configured to be held by the specimen holder,
   wherein:
      the dummy specimen has an outer diameter greater than an outer diameter of the electrostatic chuck, and
      the specimen has an outer diameter smaller than the outer diameter of the electrostatic chuck.

7. The charged particle beam apparatus according to claim 6, wherein a thickness of the dummy specimen is substantially equal to a thickness of the specimen.

8. The charged particle beam apparatus according to claim 6, wherein a material of the dummy specimen is substantially equal to a material of the specimen.

9. The charged particle beam apparatus according to claim 6, wherein the dummy specimen held on the electrostatic chuck is electrically earthed to be kept at a predetermined voltage.

10. The charged particle beam apparatus according to claim 6, wherein the dummy specimen has a predetermined pattern.

11. A dummy specimen to be held on an electrostatic chuck of a charged particle beam apparatus together with a specimen irradiated with a charged particle beam so that the specimen is observed or processed, wherein:
   an inner diameter of the dummy specimen is greater than an outer diameter of the specimen, and
   an outer diameter of the dummy specimen is greater than an outer diameter of the electrostatic chuck.

* * * * *